United States Patent
Murao

(10) Patent No.: US 7,602,243 B2
(45) Date of Patent: Oct. 13, 2009

(54) AMPLIFIER

(76) Inventor: Yoji Murao, c/o NEC Corporation, 7-1, Shiba 5-chome, Minato-ku, Tokyo 108-8001 (JP)

( * ) Notice: Subject to any disclaimer, the term of this patent is extended or adjusted under 35 U.S.C. 154(b) by 33 days.

(21) Appl. No.: 11/928,664

(22) Filed: Oct. 30, 2007

(65) Prior Publication Data

US 2008/0278231 A1 Nov. 13, 2008

(30) Foreign Application Priority Data

Nov. 15, 2006 (JP) ............................. 2006-308529

(51) Int. Cl.
H03G 3/20 (2006.01)
(52) U.S. Cl. ...................................... 330/136
(58) Field of Classification Search .................. 330/10, 330/136
See application file for complete search history.

(56) References Cited

U.S. PATENT DOCUMENTS

| 6,141,541 | A | 10/2000 | Midya et al. |
| 6,624,712 | B1 | 9/2003 | Cygan et al. |
| 6,774,719 | B1 * | 8/2004 | Wessel et al. ............... 330/136 |
| 2004/0198271 | A1 * | 10/2004 | Kang ....................... 455/127.1 |
| 2006/0033569 | A1 | 2/2006 | Mobin et al. |

FOREIGN PATENT DOCUMENTS

| JP | 2003524988 | 8/2003 |
| JP | 2003332852 | 11/2003 |
| JP | 2004207939 | 7/2004 |
| JP | 2006093874 | 4/2006 |
| KR | 2001015947 A | 3/2001 |
| KR | 2004034462 A | 4/2004 |
| WO | 0163795 A1 | 8/2001 |
| WO | 02095932 A1 | 11/2002 |
| WO | 2004075398 A1 | 9/2004 |
| WO | 2005027342 A1 | 3/2005 |
| WO | 2006073620 A1 | 7/2006 |

OTHER PUBLICATIONS

United Kingdom Search Report for GB Patent Application No. GB0722090.8, searched Feb. 12, 2008.
Korean Office Action for KR 2007-116833 dated May 27, 2009.

* cited by examiner

Primary Examiner—Steven J Mottola

(57) ABSTRACT

An object of the present invention is, in a high-frequency amplifier using a semiconductor device as an amplifying device, to achieve a high efficiency by controlling input/output matching circuits so that they are always optimized, when a bias voltage applied to the semiconductor device is controlled to correspond to an envelope of a signal. The bias voltage that is applied to the semiconductor device for amplification is changed to corresponding to the envelope of the signal using a bias control circuit, control voltages for controlling impedance of input/output matching circuits are created from the bias voltage, and the bias voltage and the control voltages that are used to control the impedance of the input/output matching circuits of semiconductor device 7 are supplied in synchronization with each other. Accordingly, the impedance of the input/output matching circuits is variably controlled so that the circuits always optimized manner, and thereby high efficiency amplification can be accomplished.

20 Claims, 5 Drawing Sheets

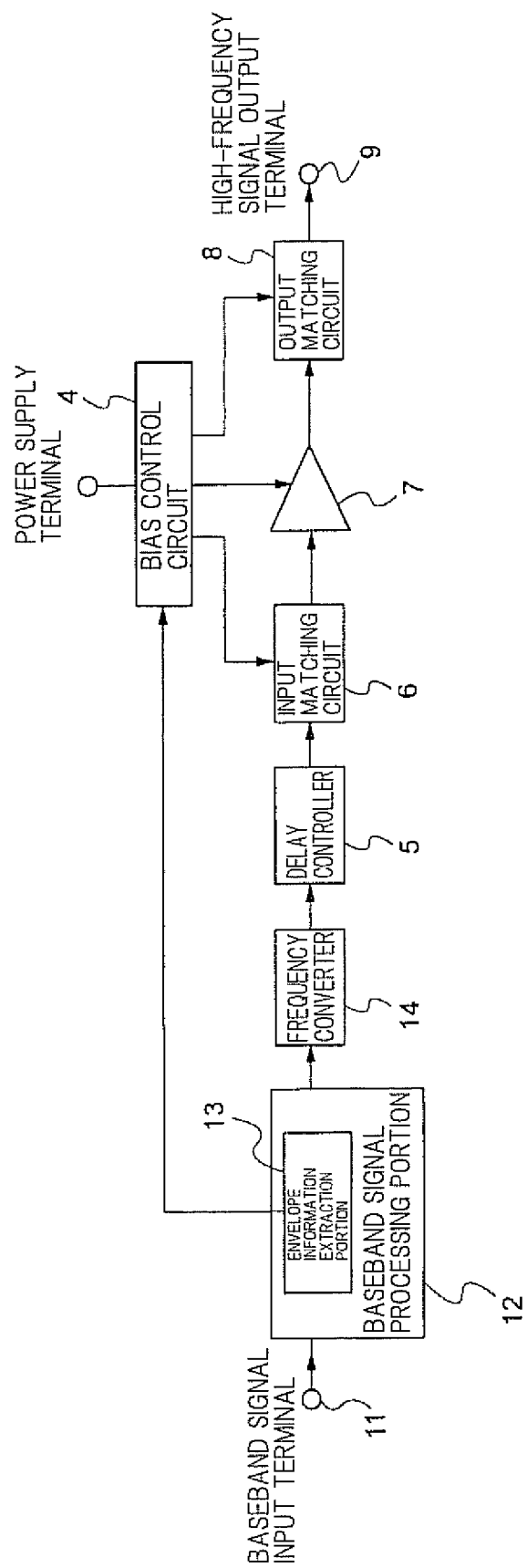

AMPLIFIER

This application is based upon and claims the benefit of priority from Japanese patent application No. 2006-308529, filed on Nov. 15, 2006, the disclosure of which is incorporated herein in its entirety by reference.

BACKGROUND OF THE INVENTION

1. Field of the Invention

The present invention relates to an amplifier, and especially to a high-frequency amplifier.

2. Description of the Related Art

In recent broadband communication systems, a signal is used whose peak power is larger than average power by about 10 dB. In such a case, to transmit information without an error, a high-frequency amplifier which can transmit peak power that is 10 dB or more higher than the average transmission power during the transmitting stage has to be used.

Generally, an amplifier has lower power efficiency, as the ratio of the peak power to the average transmission power (called "back-off") becomes larger. On the other hand, because of an increase in the level of environmental awareness, lower power consumption is also required in radio communication systems, and especially, it is desired that the high-frequency amplifier increases efficiency of power consumption rate.

Approaches to increasing the efficiency of the high-frequency amplifier include a method, such as an envelope tracking system or an envelope elimination and restoration (EER) system that makes a drain voltage of an FET (Field effect transistor), which is an amplifying element of an amplifier, change in synchronization with the envelope of a signal. For example, a method, as disclosed in Japanese Patent Application Laid-Open No. 2006-093874, makes the back-off small to increase efficiency, by lowering the drain voltage to decrease the peak power of an amplifier, when a signal level is low.

Here, a high-frequency amplifier accomplishes impedance matching by providing a matching circuit in the input/output portions of a semiconductor device for amplification such as an FET or a bipolar transistor. However, the impedance of the semiconductor device generally changes, when bias conditions are changed, and therefore, even if the matching circuit is optimized under some bias conditions, it is not necessarily optimized under different bias conditions.

Then, as a technique to provide matching in conformity with the bias conditions, National Publication of International Patent Application No. 2003-524988 discloses an envelope tracking amplifier corrects the impedance of input/output matching circuits that corresponds to an envelope of an input signal.

The amplifier described in National Publication of International Patent Application No. 2003-524988 implements impedance correction of the input/output matching circuits correspondingly to the envelope of the input signal.

In the above amplifier, but voltage control of a semiconductor device for amplification but voltage control is applied to a semiconductor device used as an amplifying device to vary the bias voltage and control voltage in order to variably control the impedance of the input/output matching circuits that are configured independently of each other, so that optimized matching circuits are not provided when timing of each voltage control is shifted from each other, which presents a problem that good efficiency control cannot be carried out.

SUMMARY OF THE INVENTION

The present invention seeks to provide an amplifier which operates at high efficiency by optimizing the controls of input/output matching circuits.

An amplifier of the present invention being adapted to change a bias voltage supplied to the semiconductor device correspondingly to an envelope of a signal to be amplified.

An amplifier of the present invention includes a semiconductor device for amplification, input/output matching circuits for the semiconductor device, and a unit for varying impedance of the input/output matching circuits correspondingly to the envelope in synchronization with the basis voltage.

The present invention produces an effect in which the controls of input/output matching circuits can be optimized and the amplifier can operate at high efficiency by changing the bias voltage of a semiconductor device used as an amplifying device and impedance of the input/output matching circuits in synchronization with an envelope of a signal.

BRIEF DESCRIPTION OF THE DRAWINGS

FIG. 7 is a block diagram of another embodiment of the present invention.

EXEMPLARY EMBODIMENT

Now, embodiments of the present invention will be hereinafter described with reference to the accompanying drawings.

Figure 1:
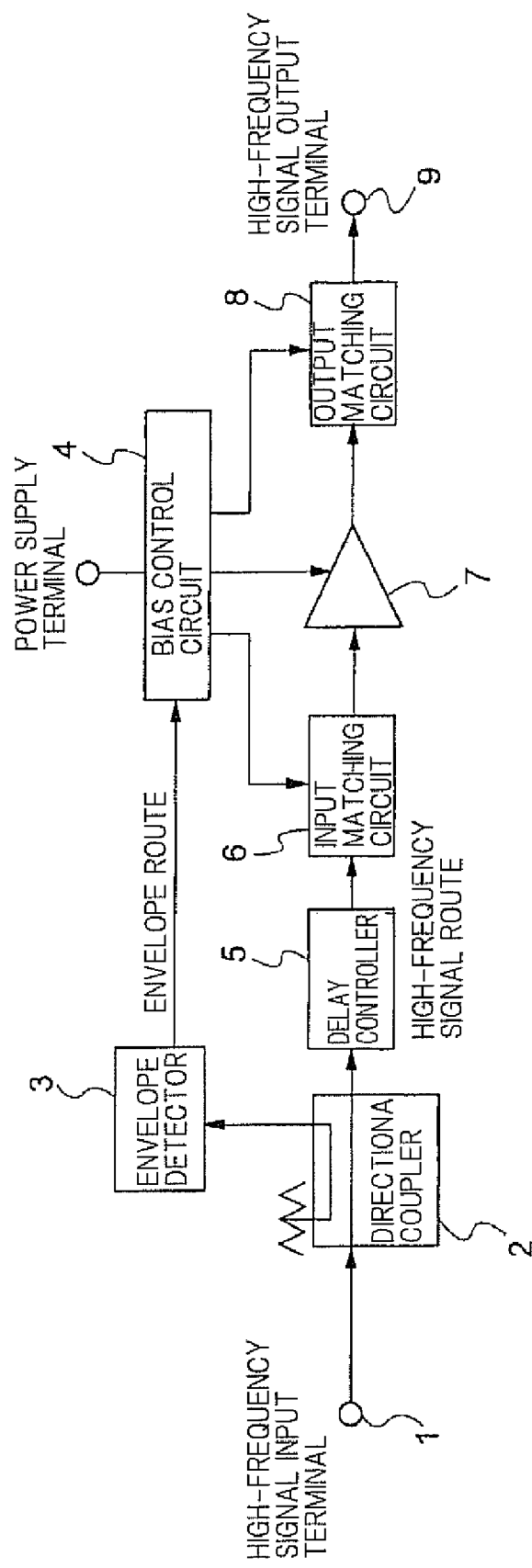
FIG. 1 is a functional block diagram of an embodiment of the present invention.

FIG. 1 is a functional block diagram illustrating an embodiment of the present invention. In FIG. 1, a high-frequency signal supplied to high-frequency signal input terminal 1 is divided by directional coupler 2 to branch into a high-frequency signal route and an envelope route.

In the high-frequency signal route, the timing of the high-frequency signal is controlled by delay controller 5 to eliminate differential delay from the envelope route, and subsequently the high-frequency signal is input to semiconductor device for amplification (FET) 7 through input matching circuit 6. The amplified output from semiconductor device for amplification 7 is output from high-frequency signal output terminal 9 through output matching circuit 8.

In the envelope route, the high-frequency signal has its envelope detected by envelope detector 3. The detected output of envelope detector 3 is input to bias control circuit 4. Bias control circuit 4 is adapted to control a bias voltage of semiconductor device for amplification 7 that corresponds to the envelope which is the detected output and also to control impedances of input matching circuit 6 and output matching circuit 8.

Figure 2:
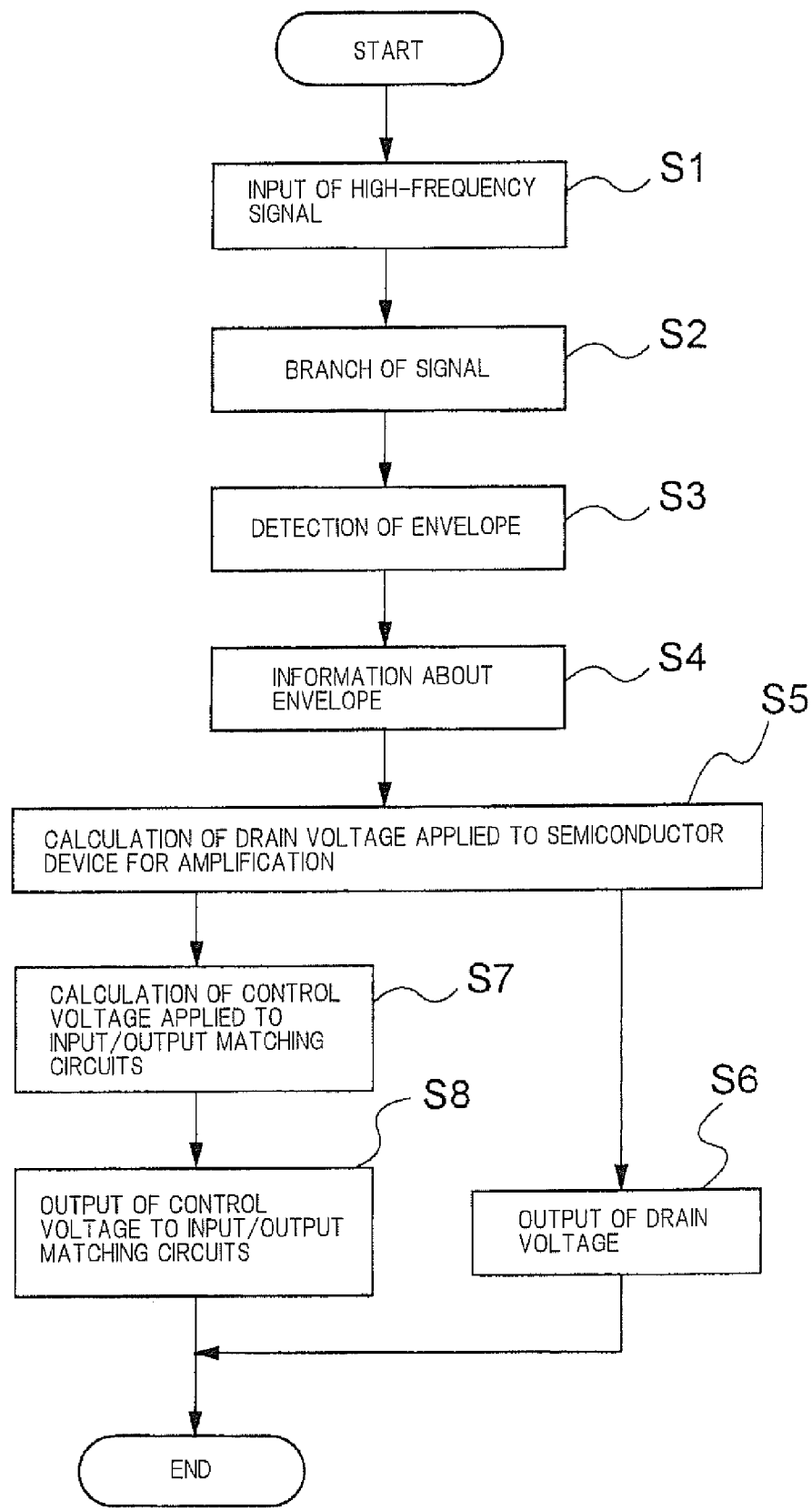
FIG. 2 is a flow chart illustrating operation of the embodiment of the present invention.

FIG. 2 is a flow chart illustrating operation of the embodiment shown in FIG. 1 of the present invention.

The high-frequency signal is supplied to high-frequency signal input terminal 1 (step S1) and divided by directional coupler 2 into branch (step S2).

Subsequently its envelope is detected by envelope detector 3 (step S3), and only information about the envelope is extracted (step S4).

The information about the envelope is input to bias control circuit 4, and the bias voltage for semiconductor device for amplification 7 is calculated by bias control circuit 4 based on the information about the envelope (step S5). In addition, in the present embodiment, when this semiconductor device for amplification 7 is an FET, the bias voltage turns into a drain voltage, the resultant drain voltage is supplied to a drain terminal of the FET (step S6).

In parallel with this operation, control voltages to be supplied to the input/output matching circuits are derived from the drain voltage calculated at step S5 (step S7), and these resultant control voltages are applied to input/output matching circuits 6, 8, respectively (step S8). A method for calculating the control voltages applied to the input/output matching circuits 6 and 8 at step S7 will be hereinafter described.

Figure 3:
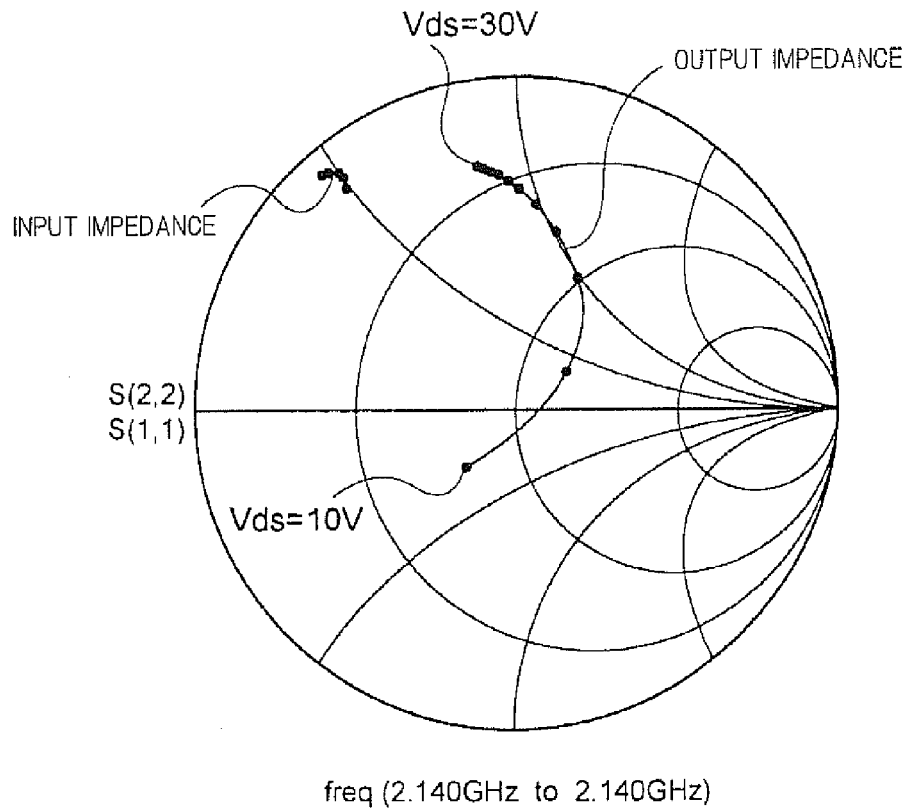
FIG. 3 is a Smith chart illustrating change in input/output impedance for change of the drain-source voltage Vds in an FET device.

Referring to FIG. 3, a Smith chart shows one example of input/output impedances of the FET which is semiconductor device for amplification 7, the chart showing the case where drain-source voltage Vds is changed in the range from +10 V to +30 V.

As described above, it is seen that the input/output impedances of the FET is varied by bias voltage Vds. Therefore, following the change in the input/output impedances of the FET, the impedances of input/output matching circuits 6, 8 are adapted to be varied based on the control voltages supplied by bias control circuit 4. It is conceivable that specific methods for calculating this control voltage include a method using a ROM table which records, in advance, information about the control voltage to implement optimized impedance for each of input/output matching circuits 6, 8 for drain-source voltage Vds of the FET.

That is, the control voltage applied to a variable impedance device (for example, a variable capacity diode) is calculated in advance to correspond to Vds and is stored in the ROM table, in order to match the impedance of each of input/output matching circuits 6, 8 with the input/output impedance that corresponds to Vds of the FET shown in FIG. 3. Then, the control voltages supplied to input/output matching circuits 6, 8 are read out with reference to the ROM table, based on Vds to be applied to the FET.

Another method is one in which the control voltage supplied to input/output matching circuits 6, 8 for Vds of the FET is approximated by a polynomial equation, and the control voltage is calculated using this polynomial equation. For example, let x be Vds of the FET and let y be the control voltage of the input/output matching circuits, and then y can be approximated by the equation $y=a0+a1 \cdot x+a2 \cdot x^2+ \ldots +an \cdot x^n$. In addition, a0, ... an are coefficients, and n is a positive integer. Further, another method such as a method in which Vds to be applied to the FET, is applied to input/output matching circuits 6, 8 using a passive device such as a resistance voltage divider because division may be also used.

Figure 4:
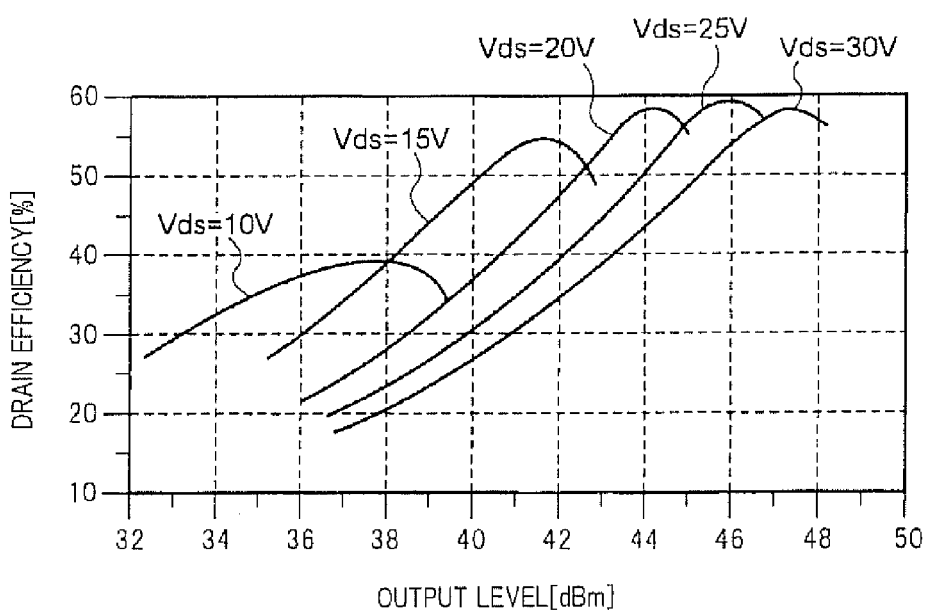
FIG. 4 is a view illustrating change in drain efficiency for change in Vds of the FET device in the embodiment of the present invention.

FIG. 4 is a view illustrating an example of the calculation results of drain efficiency, when Vds of FET (semiconductor device for amplification 7) is changed according to the present invention, and the horizontal axis shows the output and the longitudinal axis shows the drain efficiency, respectively. Five graphs respectively correspond to the drain voltages, +10 V, +15 V, +20 V, +25 V, and +30 V. In addition, in the embodiment of FIG. 1, the control voltages in both input/output matching circuits 6, 8 are changed to correspond to Vds, but an example of FIG. 4 shows, for simplicity of calculation, the case where only the control voltage of output matching circuit 8 is changed.

Figure 5:
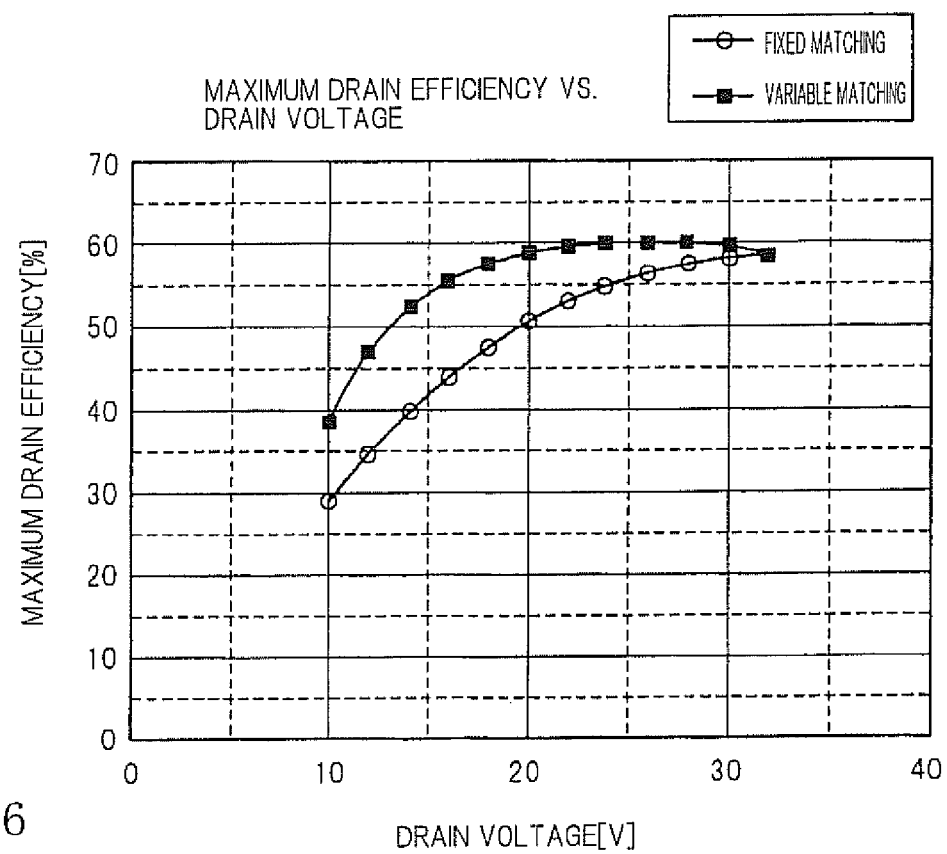
FIG. 5 is a view illustrating change in the maximum drain efficiency for change in Vds of the FET device in the embodiment of the present invention, along with a conventional example.

As is apparent from FIG. 4, the maximum output level of the drain efficiency exists in the graph of each voltage Vds, and the graph of "variable matching" shown in FIG. 5 plots the relation between the maximum drain efficiency and Vds. The graph shows the case where the impedances of the matching circuits are variably controlled according to the present invention. Also as is apparent from the graph of "variable matching", when Vds is not smaller than about 20 V, the maximum drain efficiency is a little smaller than about 60% and is constant.

However, the graph of "fixed matching" in FIG. 5 shows the case where only Vds of the FET is changed to correspond to the envelope of the signal without variably controlling the impedance of the matching circuits.

Figure 6:
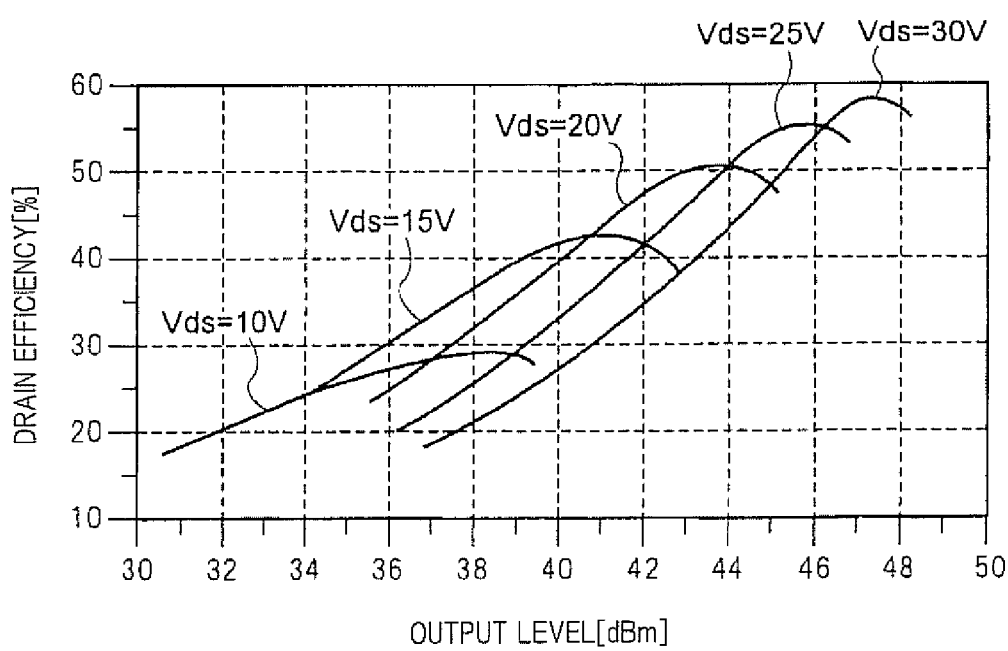
FIG. 6 is a view illustrating change in the drain efficiency for change in Vds of the FET device in the conventional example.

This graph plots the relation between maximum drain efficiency in the output level vs. the drain efficiency shown in FIG. 6 in the case where the impedance of the matching circuits are not changed and the Vds.

As is apparent from this graph of "fixed matching" in FIG. 5 and the graph of "variable matching" according to the present invention, it may be seen that the present invention improves the drain efficiency, and especially when Vds is not larger than 20 V, the improvement is not smaller than 10%.

FIG. 7 is a block diagram of another embodiment of the present invention, and portions similar to those of FIG. 1 are denoted by like symbols. In the present embodiment, the present invention is applied to a radio communication apparatus having baseband signal processing portion 12 and frequency converter 14, in addition to the high-frequency amplifier shown in FIG. 1. In the present embodiment, information about an envelope of a signal at baseband signal input terminal 11 is extracted by envelope information extraction portion 13 in baseband signal processing portion 12. When bias control circuit 4 in FIG. 1 is implemented by a digital signal processing function, as shown in FIG. 7, configuring a circuit becomes easier by treating with the envelope information as a baseband signal.

In digital multi-level modulation systems such as QPSK and QAM, because information is represented by amplitude and a phase, the amplitude information can be directly used as envelope information. As one example, the amplitude is calculated directly from an in-phase/quadrature-phase (I/Q) digital signal ($\sqrt{(I^2+Q^2)}$), and this is used as the envelope information. Alternatively, in a case where i and q respectively serve as the amplitude of each of signals in a base band into which the I/Q digital signal is converted by a Digital-to-Analog (D/A) converter, the amplitude is $\sqrt{(i^2+q^2)}$ and this can be used as the envelope information.

Further, in the embodiment of FIG. 7, directional coupler 2 and envelope detector 3 in FIG. 1 naturally become unnecessary, but except for directional coupler 2 and envelope detector 3, the configuration is similar to that of FIG. 1.

In such a manner, in the present invention, when the bias voltage of a semiconductor device used as an amplifying device is changed to correspond to the envelope of the signal, also the input/output impedance of the input/output matching circuits for the semiconductor device is also concurrently varied in synchronization. Accordingly, the efficiency of the amplifier is improved.

In addition, by inserting delay controller 5 in the high-frequency signal route, timing adjustment between the high-frequency signal route and the envelope route can be implemented, and thereby high efficiency can always be expected.

That is, accurate control of efficiency can always be accomplished by controlling the time delay for the high-frequency signal by delay controller 5, in order to synchronize the timing at which the high-frequency signal is applied to semiconductor device 7 with the timing at which the bias voltage applied to semiconductor device 7 and the control voltages applied to the input/output matching circuits are changed and controlled by bias control circuit 4.

Further, in order to control delay, this delay controller 5, as required, can also be controlled so that it corresponds to a voltage applied to a semiconductor device that is used as amplification device 7.

As described above, the optimized input/output impedance of the semiconductor device used as an amplifying device changes correspondingly to the bias voltage applied thereto, but also a rate of the change may be different depending on a signal frequency, and also the optimum amount of delay may be different at each bias voltage. To correct this, the delay provided by delay controller 5 may be also controlled to correspond to the bias voltage.

In the embodiments described above, the FET is used for semiconductor device that is used as amplification device 7 and drain-source voltage Vds as the bias voltage has been described, but the bias voltage may be gate-source voltage Vgs or, not limited to a FET, a bipolar transistor may also be used. The bias voltage in this case is collector-emitter voltage Vce or base-emitter voltage Vbe.

A known phase shifter of a voltage control type may be used for input/output matching circuits 6, 8 in FIGS. 1, 7. This is because, impedance has amplitude information and phase information, so that, impedance of the input/output matching circuits can be variably controlled by variably changing the phase to vary the impedance.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

What is claimed is:

1. An amplifier including a semiconductor device for amplification and an input/output matching circuit for the semiconductor device for amplification, the amplifier being adapted to change a bias voltage supplied to the semiconductor device that corresponds to an envelope of a signal to be amplified, comprising:
   means for varying impedance of the input/output matching circuit that corresponds to the envelope in synchronization with the bias voltage,
   wherein the means creates a control voltage for varying the impedance of the input/output matching circuit to correspond to the bias voltage, and
   wherein the means calculates the control voltage by one of:
      using a polynomial approximation technique based on the bias voltage;
      by dividing the bias voltage with a resistor.

2. The amplifier according to claim 1, wherein
   the means has a table for storing, in advance, the control voltage corresponding to each bias voltage that corresponds to the envelope, and is adapted to read out the control voltage corresponding to this bias voltage with reference to the table.

3. The amplifier according to claim 1, wherein
   the matching circuit is a variable phase shifter of an input/output voltage control type.

4. The amplifier according to claim 1, wherein
   information about the envelope is extracted from information about amplitude of a digital signal in a baseband signal processing portion in a previous stage.

5. The amplifier according to claim 1, further comprising:
   control means for synchronizing timing for applying the signal to be amplified to the semiconductor device with timing for changing the bias voltage and the control voltage.

6. An amplifier including a semiconductor device for amplification and an input/output matching circuit for the semiconductor device for amplification, the amplifier being adapted to change a bias voltage supplied to the semiconductor device that corresponds to an envelope of a signal to be amplified, comprising:
   an envelope information extraction portion for extracting the envelope information from a baseband signal, and
   a bias control circuit for varying impedance of the input/output matching circuit that corresponds to the envelope information in synchronization with the bias voltage,
   wherein the information about the envelope is extracted from information about amplitude of a digital signal in a baseband signal processing portion in a previous stage.

7. An amplifier including a semiconductor device for amplification and an input/output matching circuit for the semiconductor device for amplification, the amplifier being adapted to change a bias voltage supplied to the semiconductor device that corresponds to an envelope of a signal to be amplified, comprising:
   bias control circuit for varying impedance of the input/output matching circuit that corresponds to the envelope in synchronization with the bias voltage,
   wherein the matching circuit is a variable phase shifter of an input/output voltage control type.

8. The amplifier of claim 6, wherein the bias control circuit creates a control voltage for varying the impedance of the input/output matching circuit to correspond to the bias voltage.

9. The amplifier of claim 8, wherein the bias control circuit calculates the control voltage by using a polynomial approximation technique based on the vias voltage.

10. The amplifier of claim 8, wherein the bias control circuit calculates the control voltage by dividing the bias voltage with a resistor.

11. The amplifier of claim 8, wherein the bias control circuit has a table for storing, in advance, the control voltage corresponding to each bias voltage that corresponds to the envelope, and is adapted to read out the control voltage corresponding to this bias voltage with reference to the table.

12. The amplifier of claim 7, wherein the bias control circuit creates a control voltage for varying the impedance of the input/output matching circuit to correspond to the bias voltage.

13. The amplifier of claim 12, wherein the bias control circuit calculates the control voltage by using a polynomial approximation technique based on the vias voltage.

14. The amplifier of claim 12, wherein the bias control circuit calculates the control voltage by dividing the bias voltage with a resistor.

15. The amplifier of claim 12, wherein the bias control circuit has a table for storing, in advance, the control voltage corresponding to each bias voltage that corresponds to the envelope, and is adapted to read out the control voltage corresponding to this bias voltage with reference to the table.

16. An amplifier to amplify a carrier signal modulated by an envelope signal, the amplifier comprising:
- a semiconductor device to amplify the carrier signal modulated by the envelope signal;
- an input/output matching circuit for the semiconductor device to amplify the carrier signal modulated by the envelope signal, the amplifier being adapted to change a bias voltage supplied to the semiconductor device, the bias voltage corresponding to the envelope signal; and,
- means for varying impedance of the input/output matching circuit, the impedance corresponding to the envelope signal, the impedance synchronized to the carrier signal, for the carrier signal to be amplified by the semiconductor device by the bias voltage.

17. The amplifier of claim 16, further comprising a bias control circuit to create a control voltage to vary the impedance of the input/output matching circuit to correspond to the bias voltage.

18. The amplifier of claim 17, wherein the bias control circuit is to calculate the control voltage by using a polynomial approximation technique, based on the bias voltage.

19. The amplifier of claim 17, wherein the bias control circuit is to calculate the control voltage by dividing the bias voltage using a resistor.

20. The amplifier of claim 17, wherein the bias control circuit comprises a table to store in advance the control voltage corresponding to each bias voltage that corresponds to the envelope signal, the bias control circuit being adapted to read the control voltage corresponding to the bias voltage by referencing the table.

* * * * *